United States Patent
Fontecchio et al.

(10) Patent No.: US 9,140,923 B2
(45) Date of Patent: Sep. 22, 2015

(54) POLYMER DISPERSED LIQUID CRYSTAL PHOTOVOLTAIC DEVICE AND METHOD FOR MAKING

(75) Inventors: Adam Fontecchio, Exton, PA (US); Jared Coyle, Souderton, PA (US)

(73) Assignee: Drexel University, Philadelphia, PA (US)

( * ) Notice: Subject to any disclaimer, the term of this patent is extended or adjusted under 35 U.S.C. 154(b) by 388 days.

(21) Appl. No.: 13/123,977

(22) PCT Filed: Oct. 14, 2009

(86) PCT No.: PCT/US2009/060617
§ 371 (c)(1),
(2), (4) Date: Apr. 13, 2011

(87) PCT Pub. No.: WO2010/045308
PCT Pub. Date: Apr. 22, 2010

(65) Prior Publication Data
US 2011/0199563 A1  Aug. 18, 2011

Related U.S. Application Data

(60) Provisional application No. 61/105,275, filed on Oct. 14, 2008.

(51) Int. Cl.
*G02F 1/133*     (2006.01)
*G02F 1/1333*    (2006.01)
(Continued)

(52) U.S. Cl.
CPC .......... *G02F 1/1334* (2013.01); *H01L 51/0076* (2013.01); *H01L 51/4253* (2013.01); *H01L 51/0037* (2013.01); *Y02E 10/549* (2013.01)

(58) Field of Classification Search
CPC ...... B82Y 10/00; B82Y 20/00; H01G 9/2072; H01L 31/04; H01L 31/00; H01L 27/301; H01L 31/02167; H01L 31/022425; Y02E 10/549; Y02E 10/50; Y10S 977/948; G02F 1/1334; G02F 2202/36; G02F 1/1323; C09K 2219/03; Y10T 428/10; Y10T 156/10
USPC .......................... 349/86, 90, 92; 136/252, 263
See application file for complete search history.

(56) References Cited

U.S. PATENT DOCUMENTS 4,564,266 A * 1/1986 Durand et al. ................ 349/177
5,142,644 A   8/1992 VanSteenkiste et al.
(Continued)

FOREIGN PATENT DOCUMENTS

JP  2002029524   6/2002
JP  2002335004 A 11/2002
(Continued)

OTHER PUBLICATIONS

L. Schmidt-Mende, et al., "Self-Organized Discotic Liquid Crystals for High-Efficiency Organic Photovoltaics," Science, Aug. 10, 2001, pp. 1119-1122, vol. 293.
(Continued)

*Primary Examiner* — Edward Glick
*Assistant Examiner* — David Chung
(74) *Attorney, Agent, or Firm* — Mendelsohn, Drucker & Dunleavy, P.C.

(57) ABSTRACT

A novel photovoltaic device including a polymer dispersed liquid crystal (PDLC) material that is capable of converting solar energy to electrical energy and method for making. The device may optionally include a conductive container for holding the PDLC material. In an exemplary embodiment, the invention is directed to a self assembled PDLC material, a holographically synthesized PDLC material or a block copolymer dispersed liquid crystal material. It is envisioned that the invention may be used a power source for any device, system or application. In particular, the invention may be used for any application involving the conversion of solar energy to electrical energy.

20 Claims, 5 Drawing Sheets

(51) Int. Cl.
*G02F 1/1334* (2006.01)
*H01L 51/42* (2006.01)
*H01L 51/00* (2006.01)

(56) References Cited

U.S. PATENT DOCUMENTS

| | | | |
|---|---|---|---|
| 5,225,104 A | | 7/1993 | VanSteenkiste et al. |
| 6,132,819 A | * | 10/2000 | Ober et al. .................. 428/1.1 |
| 6,166,800 A | * | 12/2000 | Silverstein et al. ........... 349/201 |
| 6,323,923 B1 | | 11/2001 | Hoshino et al. |
| 6,538,775 B1 | | 3/2003 | Bowley et al. |
| 6,580,026 B1 | | 6/2003 | Koyanagi et al. |
| 7,072,020 B1 | | 7/2006 | Sutherland et al. |
| 7,206,044 B2 | | 4/2007 | Li et al. |
| 7,226,966 B2 | | 6/2007 | Kambe et al. |
| 7,247,659 B2 | | 7/2007 | Kura et al. |
| 7,420,203 B2 | | 9/2008 | Tsutsui et al. |
| 2003/0127967 A1 | | 7/2003 | Tsutsui et al. |
| 2005/0016441 A1 | * | 1/2005 | Masutani et al. ................ 117/2 |
| 2005/0126628 A1 | | 6/2005 | Scher et al. |
| 2005/0156197 A1 | | 7/2005 | Tsutsui et al. |
| 2005/0259193 A1 | * | 11/2005 | Sumiyoshi et al. ............. 349/62 |
| 2007/0062577 A1 | * | 3/2007 | Koppe ........................ 136/263 |
| 2007/0089779 A1 | * | 4/2007 | Balasubramanian et al. 136/252 |
| 2007/0289626 A1 | * | 12/2007 | Brabec et al. ................. 136/263 |
| 2008/0087326 A1 | * | 4/2008 | Scholes et al. ............... 136/263 |

FOREIGN PATENT DOCUMENTS

| | | |
|---|---|---|
| JP | 20030264085 A | 9/2003 |
| WO | 2006101814 A2 | 9/2006 |

OTHER PUBLICATIONS

K. Scott, et al., "Quantum Efficiency of Photogeneration in Discotic Liquid Crystals: Part 1: Temperature and Wavelength Dependence," Molecular Crystals and Liquid Crystals Science and Technology, 2003, pp. 253-261, vol. 397.

K. Scott, et al., "Quantum Efficiency of Photogeneration in Discotic Liquid Crystals: Part 2: Electric Field and Temperature Dependence," Molecular Crystals and Liquid Crystals Science and Technology, 2003, pp. 263-271, vol. 397.

Richard J. Bushby, et al., "Photoconducting Liquid Crystals," Current Opinion in Solid State and Material Science, 2002, pp. 569-578, vol. 6.

K. J. Donovan, et al., "Molecular Engineering the Phototransport Properties of Discotic Liquid Crystals," Molecular Crystals and Liquid Crystals Science and Technology, 2003, pp. 91-112, vol. 396.

Ioan Paraschiv, "H-Bond Stabilized Columnar Discotic Liquid Crystals," Ph.D. Thesis Wageningen University, Jan. 19, 2007.

S. Laschat, et al., "Discotic Liquid Crystals: From Tailor-Made Synthesis to Plastic Electronics," Angewandte Chemie International Edition, 2007, pp. 4832-4887, vol. 46.

A. Rybak, et al., "Charge Carrier Transport in Layers of Discotic Liquid Crystals as Studied by Transient Photocurrents," Synthetic Metals, 2006, pp. 302-309, vol. 156.

K. Yoshino, et al., "Novel Electrical and Optical Properties of Discotic Liquid Crystals, Substituted Phthalocyanine Rare-Earth Metal Complexes," Proceedings of 13th International Conference on Dielectric Liquids (ICDL 1999) Nara, Japan, Jul. 20-25, 1999, pp. 598-601.

Xiaoli Zhou, et al., "Nature Inspired Well-Defined Discotic Liquid Crystal Porphyyrins for Organic Photovoltaics: New Opportunity and New Challenge," Colorado Renewable Energy Collaboratory Poster Abstracts for the Workshop on Efficient Conservation of Solar Energy to Electricity and Fuel Cells, poster 35 http://www.coloradocollaboratory.org/crsp_abstracts.html., viewed Oct. 13, 2006.

Marcel Kastler, "Discotic Materials for Organic Electronics," Ph.D. Thesis in the Department of Chemistry, Pharmacy and Geosciences at Johannes Gutenberg-Universitat Mainz, 2006.

Michael W. Rowell, et al., "Organic Solar Cells With Carbon Nanotube Network Electrodes," Applied Physics Letters, 2006, pp. 233506-1-233506-3, vol. 88.

Ross Ulbricht, et al., "Transparent Carbon Nanotube Sheets as 3-D Charge Collectors in Organic Solar Cells," Solar Energy Materials & Solar Cells, 2007, pp. 416-419, vol. 91.

G. Li, et al. "Efficient Inverted Polymer Solar Cells," Applied Physics Letters, 2006, pp. 253503-1-253503-3, vol. 88.

Gavin A. Buxton, et al., "Computer Simulation of Polymer Solar Cells," Modeling Simul. Mater. Sci. Eng., 2007, pp. 13-26, vol. 15, published online on Dec. 12, 2006.

Miguel Carrasco-Orozco, et. al., "New Photovoltaic Concept: Liquid-Crystal Solar Cells Using a Nematic Gel Template," Advanced Materials, 2006, pp. 1754-1758, vol. 18.

Sandeep Kumar, "Discotic Liquid Crystals for Solar Cells," Current Science, 2002, pp. 256-257, vol. 82, No. 3.

A.E. Fox, A.K. Fontecchio, "Application of Liquid crystal polymer films for photolithographic fabrication of 3D structures" Proc. SPIE 6912, 691202 (Feb. 22, 2008).

J.P. Coyle, A.K. Fontecchio, "Pourable Photovoltaic Polymer/Liquid Crystal Devices" Nanotechnology Commercialization Group of the Nanotech Institute's Green Tech Lab-to-Market Forum, Nov. 2008.

P. Coyle, A.K. Fontecchio, "Photovoltaic Polymer Dispersed Liquid Crystal Thin Films" University of Oregon NSF IGERT Retreat, Dec. 18, 2008.

* cited by examiner

POLYMER DISPERSED LIQUID CRYSTAL PHOTOVOLTAIC DEVICE AND METHOD FOR MAKING

BACKGROUND OF THE INVENTION

1. Field of Invention

The present invention is directed to polymer dispersed liquid crystal photovoltaic devices. It is envisioned that the invention may be used to convert solar energy to electrical energy.

2. Brief Description of the Prior Art

In spite of the widely appreciated magnitude of what has come to be called the energy crisis, there are still critical gaps in many methods currently available for energy generation. Specifically, despite recent advances in the field of renewable solar energy, current state of the art solar cells are inefficient, expensive and are limited in their application.

Recently, much attention has been directed towards the development of organic solar energy devices. Carbon nanotubes (See Michael W. Rowell, et al., "Organic Solar Cells With Carbon Nanotube Network Electrodes," *Applied Physics Letters*, vol. 88, pgs. 233506-1-233506-3 (2006); Ross Ulbricht, et al., "Transparent Carbon Nanotube Sheets as 3-D Charge Collectors in Organic Solar Cells," *Solar Energy Materials & Solar Cells*, vol. 91, pgs. 416-419 (2007)), electrically conductive polymers (See G. Li, et al., "Efficient Inverted Polymer Solar Cells," *Applied Physics Letters*, vol. 88, pgs. 253503-1-253503-3 (2006); Gavin A. Buxton, et al., "Computer Simulation of Polymer Solar Cells," *Modeling Simul. Mater. Sci. Eng.*, vol. 15, pgs. 13-26 (2007), published online on Dec. 12, 2006) and various types of liquid crystals (See Miguel Carrasco-Orozco, et al., "New Photovoltaic Concept: Liquid-Crystal Solar Cells Using a Nematic Gel Template," *Advanced Materials*, vol. 18, pgs 1754-1758 (2006); Sandeep Kumar, "Discotic Liquid Crystals For Solar Cells," *Current Science*, vol. 82, no. 0.3 pgs. 256-257 (2002)) have been investigated in an attempt to overcome the problems of the prior art. Although such organic solar energy devices have yielded higher quantum efficiencies, they have a lower overall power output than current silicon based solar cell designs.

The possible use of polymer dispersed liquid crystals (PDLCs) in solar energy devices has raised some interest because PDLCs are environmentally friendly, relatively inexpensive to manufacture and have relatively high energy conversion efficiency in comparison to conventional silicon solar cells. Nematic and chiral nematic liquid crystals, in particular, have been previously investigated. While these liquid crystals work well for optical applications, their relatively small molecular structures and lack of conjugated rings make them minimally photovoltaic and therefore not ideal for solar cell applications.

Additionally, PDLCs which have been incorporated in solar energy generation systems are structurally incapable of solar energy conversion. Rather these PDLCs are typically coupled to a conventional solar cell and function to focus light towards the solar cell. For example, U.S. Pat. No. 7,206,044 (hereinafter "Li") discloses a solar cell in combination with a liquid crystal display. The liquid crystal display includes a cholesteric liquid crystal or polymer dispersed liquid crystal placed between opposing transparent plates (See col. 2, lines 11-17 of Li). A conventional solar cell is joined to one side of the liquid crystal display with a coupling layer such as a transparent adhesive material (See col. 2, lines 34-39 of Li).

U.S. Pat. No. 7,226,966 (hereinafter "Kambe") discloses a composite material comprising polymers and inorganic particles for use in fabricating optical and electro-optical materials, optical devices and integrated optical circuits (See col. 4, lines 38-47 of Kambe). Kambe mentions the possibility of, but does not describe, a PDLC photovoltaic device. Rather, Kambe discloses that the composite material may include a polymer-dispersed liquid crystal display (See col. 30, lines 12-19 of Kambe) and self-assembling block copolymers (See col. 14, lines 17-23, 52-59 of Kambe) and that photonic crystals may possibly be used in the formation of solar cells (See col. 38, lines 27-33 of Kambe).

These patents, therefore, do not effectively disclose a PDLC material that functions as a solar cell. In general, the PDLCs used in prior art systems incorporate liquid crystals which filter light rather than absorb light and the polymer matrix is typically insulating rather than conducting.

Therefore, there exists a need to develop a PDLC that is capable of efficiently converting solar energy to electrical energy.

SUMMARY OF THE INVENTION

The invention is directed to embodiments of photovoltaic devices that include a polymer dispersed liquid crystal material, having a conductive polymer and light absorbing liquid crystals and an electric lead for transmitting electrical energy generated by the photovoltaic devices.

In another embodiment, the photovoltaic device includes a photo-curable polymer dispersed liquid crystal material having a conductive polymer and a liquid crystal. The photovoltaic device also includes an electric lead and, optionally, a container for retaining said polymer dispersed liquid crystal material, wherein the container includes electrically conductive elements.

The present invention is also directed to a novel method for fabricating a photovoltaic device including the steps of synthesizing a polymer dispersed liquid crystal material having a conductive polymer and light absorbing liquid crystals, wherein the polymer dispersed liquid crystal material is capable of converting solar energy to electrical energy. The method further includes the step of incorporating an electrical lead.

BRIEF DESCRIPTION OF THE DRAWINGS

FIG. 2(*b*) is a SEM scan of one embodiment of an H-PDLC material.

FIG. 3(*b*) is a perspective view of a block co-polymer wire.

DETAILED DESCRIPTION OF THE PREFERRED EMBODIMENTS

Figure 1:
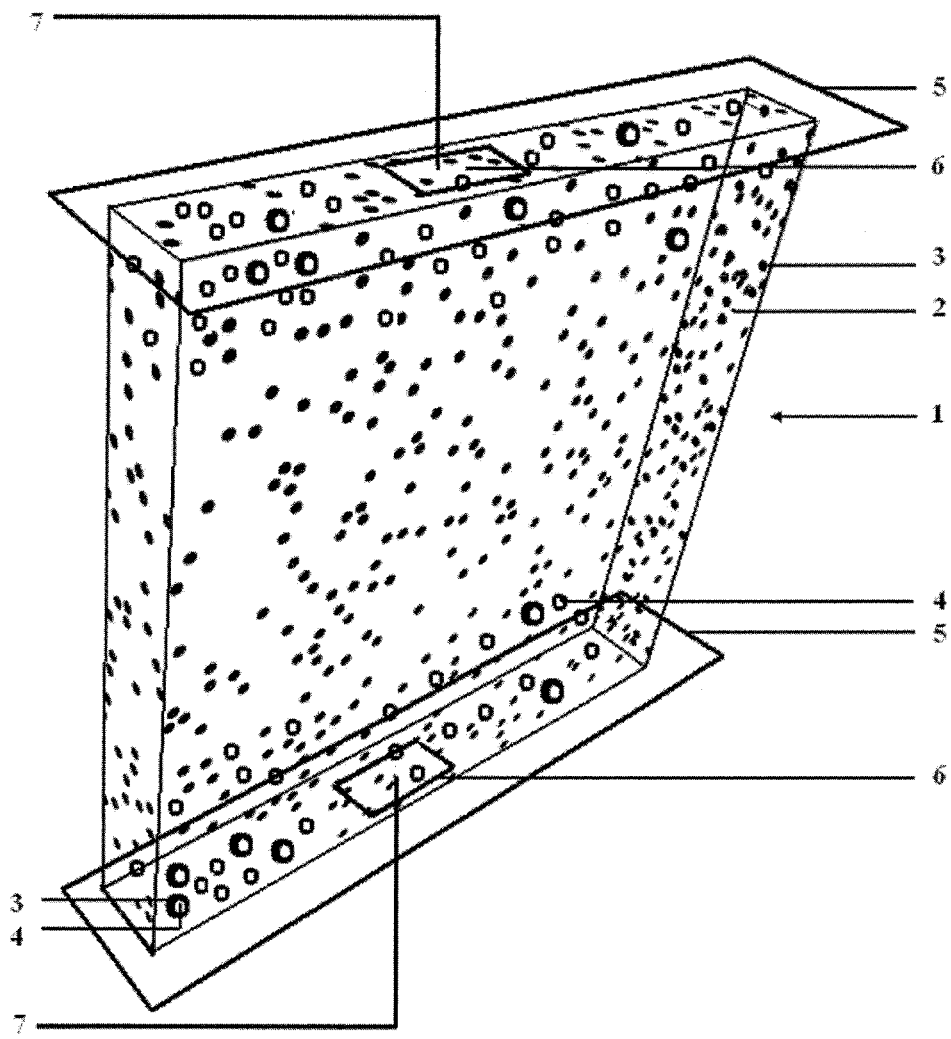
FIG. 1 is a perspective view of one embodiment of a self-assembling PDLC material.

For illustrative purposes, the principles of the present invention are described by referencing various exemplary embodiments thereof. Although certain embodiments of the invention are specifically described herein, one of ordinary skill in the art will readily recognize that the same principles are equally applicable to, and can be employed in other apparatuses and methods. Before explaining the disclosed embodiments of the present invention in detail, it is to be understood that the invention is not limited in its application to the details of any particular embodiment shown. The terminology used herein is for the purpose of description and not of limitation. Further, although certain methods are described with reference to certain steps that are presented herein in certain order, in many instances, these steps may be performed in any order as may be appreciated by one skilled in the art, and the methods are not limited to the particular arrangement of steps disclosed herein.

For purposes of the present invention, "container" may refer to a chamber defined by at least two sides, wherein the chamber may have any depth, width, height, shape or configuration suitable for retaining a polymer dispersed liquid crystal layer.

It must be noted that as used herein and in the appended claims, the singular forms "a", "an", and "the" include plural references unless the context clearly dictates otherwise. Thus, for example, reference to "a polymer" includes a plurality of polymers and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably.

The present invention is directed to a novel polymer dispersed liquid crystal (PDLC) photovoltaic device and a method for making the device. The PDLC photovoltaic device includes a PDLC material 1 that converts solar energy to electricity. PDLC material 1 may be synthesized from a conductive polymer 2 and photosensitive liquid crystals 3. More specifically, liquid crystals 3 absorb light, convert photons to electrons and induce an electron flow in conductive polymer 2. The resulting electrical current is then carried across the conductive polymer 2, and electrical leads 7 operatively associated with the conductive polymer 2 transport the current to an energy storage device or to an electrical device for immediate use. Consequently, PDLC material 1 is capable of converting solar energy to electricity without the assistance of conventional photovoltaic devices. It is envisioned that the present invention may be useful for any application involving or any device/system capable of being powered by a solar energy source.

Polymer 2 may include any conductive polymer. Preferably, polymer 2 is miscible with liquid crystal 3. One way to enhance polymer miscibility is to employ water-based polymers. Preferably, polymer 2 may also have high transparency to visible or ultraviolet light and is preferably photo-curable. Photo-curing may be carried out using, for example, ultraviolet, visible or infrared light. In an exemplary embodiment, polymer 2 may include, but is not limited to, highly conductive organic polymers such as Poly(3,4-ethylenedioxythiophene) poly(styrenesulfonate) (PEDOT:PSS), polyaniline or combinations thereof. In general, various polythiophenes, pyrazoloquinolines, polysilanes and carbon black doped ultra-high molecular weight polyethylenes may be employed in the present invention. Preferred characteristics of these materials are a sheet resistance of less than 1000 ohm/square and a bulk conductivity of greater than 500 S/cm.

Polymer 2 may further include at least one pair of electrically conductive elements 4 for inducing and directing an electric current through polymer 2. Conductive elements 4 may be any material capable of, and may have any shape or configuration suitable for conducting an electrical charge. In an exemplary embodiment, conductive elements 4 may be electrodes fabricated from metallic compounds. More preferably, the electrodes are fabricated from different metallic compounds to enable a work function difference and induce a directional current. Most preferably, the electrodes are metallic nanoparticles. Suitable materials include, but are not limited to, silver, indium, tin, tin oxide, zinc, zinc oxide, silicon, lead and copper.

Liquid crystals 3 of PDLC material 1 may include any material that is capable of absorbing photons, exciting electrons and is miscible with polymer 2. Preferably, the molecular structure and molecular orientation of liquid crystals 3 are adapted to efficiently and effectively absorb light, e.g. have a high photovoltaic activity. For example, liquid crystals 3 may have conjugated ring structures, high charge mobility and/or small bandgaps. The liquid crystal may be in any suitable phase, but is typically in an ordered phase rather than an isotropic phase. The liquid crystal material may optionally be functionalized with one or more functionalities to vary the properties of the material as discussed in greater detail below.

The system of the present invention will have both holes and electrons. Thus, exciton (a paired electron and hole) mobility is an important aspect of the materials of the present invention. Suitable liquid crystal materials will exhibit photovoltaic activity when exposed to one or more of visible, near infrared or ultraviolet radiation and are miscible in the polymer matrix material. Preferred liquid crystal materials are also thermally stable, non-isotropic at ambient temperatures (5-40° C.), metallically doped and have a large core ring structure.

Liquid crystals 3 may be any suitable photovoltaic liquid crystal. In an exemplary embodiment, liquid crystals 3 may be discotic liquid crystals, nematic liquid crystals, chiral nematic liquid crystals or a combination thereof. Preferably, liquid crystal 3 is a discotic liquid crystal which may be formed into a columnar array as shown. In one preferred embodiment, liquid crystal 3 may be a silver-complexed, large ring structure phthalocyanine, hexabenzocoronene, various oxytriphenylenes and hexatrioxaocytylthiophenylene (TP6EO2M).

Exemplary embodiments of the discotic liquid crystals are described in L. Schmidt-Mende, et al., "Self-Organized Discotic Liquid Crystals for High-Efficiency Organic Photovoltaics," *Science*, vol. 293, pgs. 1119-1122 (Aug. 10, 2001); K. Scott, et al., "Quantum efficiency of photogeneration in discotic liquid crystals: Part 1: Temperature and wavelength dependence," *Molecular Crystals and Liquid Crystals Science and Technology*, vol. 397, pgs. 253-261 (2003); K. Scott, et al., "Quantum efficiency of photogeneration in discotic liquid crystals: Part 2: Electric field and temperature dependence," *Molecular Crystals and Liquid Crystals Science and Technology*, vol. 397, pgs. 263-271 (2003); Richard J. Bushby, et al., "Photoconducting liquid crystals," *Current Opinion in Solid State and Material Science*, vol. 6, pgs. 569-578 (2002); K. J. Donovan, et al., "Molecular Engineering the Phototransport Properties of Discotic Liquid Crystals," *Molecular Crystals and Liquid Crystals Science and Technology*, vol. 396, pgs. 91-112 (2003); Ioan Paraschiv, "H-Bond Stabilized Columnar Discotic Liquid Crystals," Ph.D. Thesis Wageningen University, (Jan. 19, 2007); S. Laschat, et al., "Discotic Liquid Crystals: From Tailor-Made Synthesis to Plastic Electronics," *Angewandte Chemie International Edition*, vol. 46, pgs 4832-4887 (2007); A. Rybak, et al., "Charge carrier transport in layers of discotic liquid crystals as studied by transient photocurrents," *Synthetic Metals*, vol. 156, pgs. 302-309 (2006); K. Yoshino, et al., "Novel Electrical and Optical Properties of Discotic Liquid Crystals, Substituted Phthalocyanine Rare-Earth Metal Complexes," *Proceedings of 13th International Conference on Dielectric Liquids (ICDL '99) Nara, Japan*, July 20-25, pgs. 598-601 (1999); Xiaoli Zhou, et al., "Nature Inspired Well-Defined Discotic Liquid Crystal Porphyyrins for Organic Photovoltaics: New Opportunity and New Challenge," *Colorado Renewable Energy Collaboratory Poster Abstracts for the Workshop on Efficient Conservation of Solar Energy to Electricity and Fuel Cells*, poster 35 http://www.coloradocollaboratory.org/crsp_abstracts.html (viewed Oct. 13, 2006); Marcel Kastler, "Discotic Materials for Organic Electronics," *Ph.D. Thesis in the department of Chemistry, Pharmacy and Geosciences at Johannes Gutenberg-Universitat Mainz* (2006), the entire disclosures of which are incorporated by reference herein.

Without wishing to be bound by theory, discotic liquid crystals have a molecular structure and molecular orientation that enables conductivity. The aforementioned exemplary liquid crystals may also be combined with nematic and/or chiral nematic liquid crystals.

Optimal ratios of the amount of liquid crystal 3 and polymer material 2 will depend on the desire system properties. The range of applicable ratios is from about 20:80 to 75:25 (liquid crystal to polymer).

Liquid crystals 3 may further be functionalized or include dopants to enhance one or more of conduction, polymer miscibility and exciton travel. For example, functionalization of the liquid crystal material may be used to alter the miscibility of the liquid crystal material with the polymer and/or tune the work function of the liquid crystal material to control the band gap. For good miscibility, a $\log P_{ow}$ close to zero would be desirable. For example, to improve polymer miscibility, the liquid crystal material may be functionalized with hydrophilic groups. Band gaps comparable to those of conventional silicon semiconductor materials, e.g. about 1.4 eV are desirable. In exemplary embodiments, the functional group may be metallic cross-linking compounds, silica, hydroxyl groups, carbon nanotubes, grapheme, carbon black and metallic nanoparticles such as those described above, or any combination thereof.

PDLC material 1 fabricated from polymer 2 and liquid crystals 3, discussed above, may have material characteristics desirable for enabling solar energy conversion, as well as properties enabling use of the PDLC material 1 in a wide variety of applications. In an exemplary embodiment, PDLC material 1 may have any geometric configuration and material properties suitable for solar energy conversion. PDLC material 1 may be fabricated to have any desired thickness. In an exemplary embodiment, PDLC material 1 may have a thickness of up to 2.5 cm. In an alternative exemplary embodiment, PDLC material 1 may have a thickness of less than about 10 millionths of a meter. Preferred ranges for thin film PDLC materials are from 0.5-50 µm, while thicknesses of suitable self-assembling paint materials will typically be up to 2 mm thick. The thickness of PDLC material 1 may be customized to suit the application for which it is to be used. In an exemplary embodiment, PDLC material 1 is a liquid that conforms to the shape and configuration of its container and may polymerize or cure upon exposure to sunlight, controlled levels of electromagnetic radiation, heat, pressure, catalyzed with, for example, acid/base or metal, or a combination thereof. Because PDLC material 1 is capable of adapting its shape upon polymerization, it may be customized for a wide variety of applications.

In an exemplary embodiment, PDLC material 1 may also be efficient in converting solar energy to electrical energy and/or capable of producing a high electrical current output. The morphological structure of the polymer/liquid crystal blends of PDLC material 1 enables effective energy conversion within liquid crystals which are physically oriented within electron carrying polymeric matrices. By taking advantage of the photovoltaic properties of the liquid crystals and the inherently conductive polymers, it is possible to synthesize a high efficiency PDLC material 1. In an exemplary embodiment, PDLC material 1 may have an overall energy conversion efficiency that is greater than about 3%, more preferably, greater than about 7% and most preferably, greater than 15%.

In various embodiments, PDLC material 1 may also be optically transparent, flexible, durable, environmentally friendly or a combination thereof. These material properties further enable PDLC material 1 to be adapted to a wide variety of applications. The PDLC material should allow light penetration of visible, near infrared and/or ultraviolet radiation of sufficient magnitude to allow a sufficient amount of the radiation to impinge on the liquid crystals 3 to provide reasonable electrical energy generation. Also, it is desirable to have a relatively large surface area of contact between liquid crystals 3 and polymer matrix 2 in order to enhance electrical conduction from liquid crystals 3 to polymer matrix 2.

Optionally, the PDLC material 1 may placed or retained in a container 5. Container 5 may include electrically conductive elements 6, which may have any geometric configuration and may be fabricated from any material suitable for conducting an electric charge generated by PDLC material 1. In an exemplary embodiment, container 5 may be optically transparent, flexible, durable, environmentally friendly or a combination thereof. In an exemplary embodiment, container 5 may be two pieces of transparent conducting glass located on either side of PDLC material 1. More preferably, at least one side of a glass surface may be reflective to reflect light towards PDLC material 1. Container 5 may be used, for example, as part of a self-assembly process for self-assembling PDLC material in situ in container 5. In such case, container 5 may define the shape of the self-assembled PDLC material.

PDLC material 1 may be vacuum-filled into an evenly spaced cell or formed between two indium tin oxide (ITO) coated glass slides spaced apart from one another by a functionally suitable distance. Alternatively, PDLC material may be spin coated onto a substrate in multiple layers.

At least one electrical lead 7 may be operatively associated with conductive elements 6 of container 5, conductive elements 4 of PDLC material 1 or a combination thereof in order to direct the generated electrical current to an energy storage device, such as a battery or capacitor, or to a device or system which is to be powered by the electrical current.

In an exemplary embodiment, PDLC material 1 of the present invention may be a self-assembled PDLC material, a holographically synthesized PDLC (H-PDLC) material or a block co-polymer dispersed liquid crystal (BCP) material.

Self-assembled PDLC materials may automatically organize one or both of liquid crystals 3 and conductive elements 4 with polymer matrix 2 during self-assembly. Upon exposure to sunlight, controlled levels of UV radiation, heat, pressure, and/or catalysts, for example, acid/base or metal, or a combination thereof, polymerization and self-assembly is initiated. During this process, liquid crystals 3 are dispersed as droplets throughout polymer matrix 2 in a random manner and conductive elements 4 may optionally be automatically positioned within polymer matrix 2 so as to conduct a charge across polymer matrix 2. Alternatively, conductive elements 4 may be separately placed in which case only the PDLC is self-assembled. Conductive elements 4 can be self-assembled, for example, by addition of silver nanoparticles and an aqueous silver complex having a lower density than the liquid precursor material such that the silver nanoparticles will sink to the bottom and form an electrode there, whereas the aqueous silver complex may float to the top and form a second electrode there. This also provides a work function differential between the two electrodes to improve the conduction of electricity in the apparatus. Other combinations of suitable electrode materials may also be self-assembled in this manner. Conductive elements 4 may be positioned anywhere within PDLC material 1. For example, conductive elements 4 may be positioned within or in direct contact polymer 2, liquid crystals 3 or a combination thereof. To enhance the conduction efficiency of PDLC material 1, in an exemplary embodiment, conductive elements 4 may be positioned within or in direct contact with liquid crystals 3.

Once polymerized, the device may be capable of supplying electrical power to any connected device. In addition to enabling self-assembly and minimizing manufacturing costs, this novel embodiment is unique in that it may be photocurable to assume any shape or configuration. Furthermore, the self-assembled PDLC may be optically transparent, highly flexible and may form passively in sunlight. These properties make the self-assembled PDLC useful for a wide variety of applications, including, for example, as a paint or coating material which can be applied to an existing substrate.

In an exemplary embodiment, the self-assembled PDLC material may be synthesized from a homogenous mixture of monomers, liquid crystals 3, photoinitiators, and conductive elements 4, such as metallic nanoparticles and water complexed metallic nanoparticles. This mixture may be poured into and subsequently conform to the shape of a container 5 upon polymerization. Upon exposure to suitable polymerization conditions, such as exposure to sunlight or controlled levels of UV radiation of about 20-220 mW/cm$^2$, more preferably, 90-120 mW/cm$^2$, and, most preferably, 100 mW/cm$^2$, the monomers react and self-assemble to form a polymeric matrix 2. Liquid crystals 3 diffuse into a normal distribution of droplets throughout the cross-linked polymer matrix 2, as shown in FIG. 1.

Conductive elements 4 also automatically self-assemble from the metallic nanoparticles and water complexed metallic nanoparticles during polymerization. For example, metallic nanoparticles, which have a higher density and/or lower solubility than the water complexed metallic particles, will settle on the bottom of the polymer solution due to gravitational forces. Aqueous complexed metallic particles, having a low density and high polarity, will phase separate to the top of the polymer solution. The inherent work function difference between the top and bottom of the polymer solution will induce a downward electric current, thereby enabling the conduction of an electrical charge from one portion of the PDLC matrix to another portion of the PDLC matrix.

Figure 2:
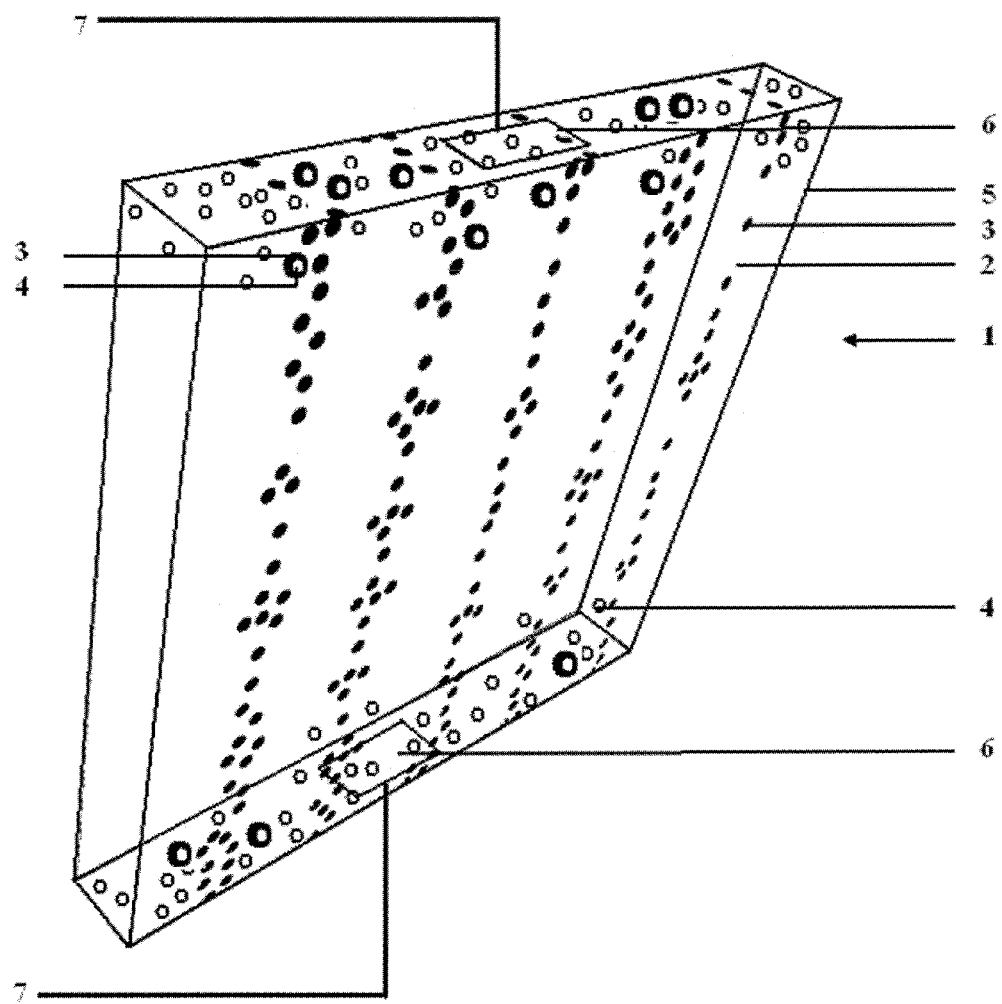
FIG. 2(*a*) is a perspective view of one embodiment of an H-PDLC material.
Figure 2:
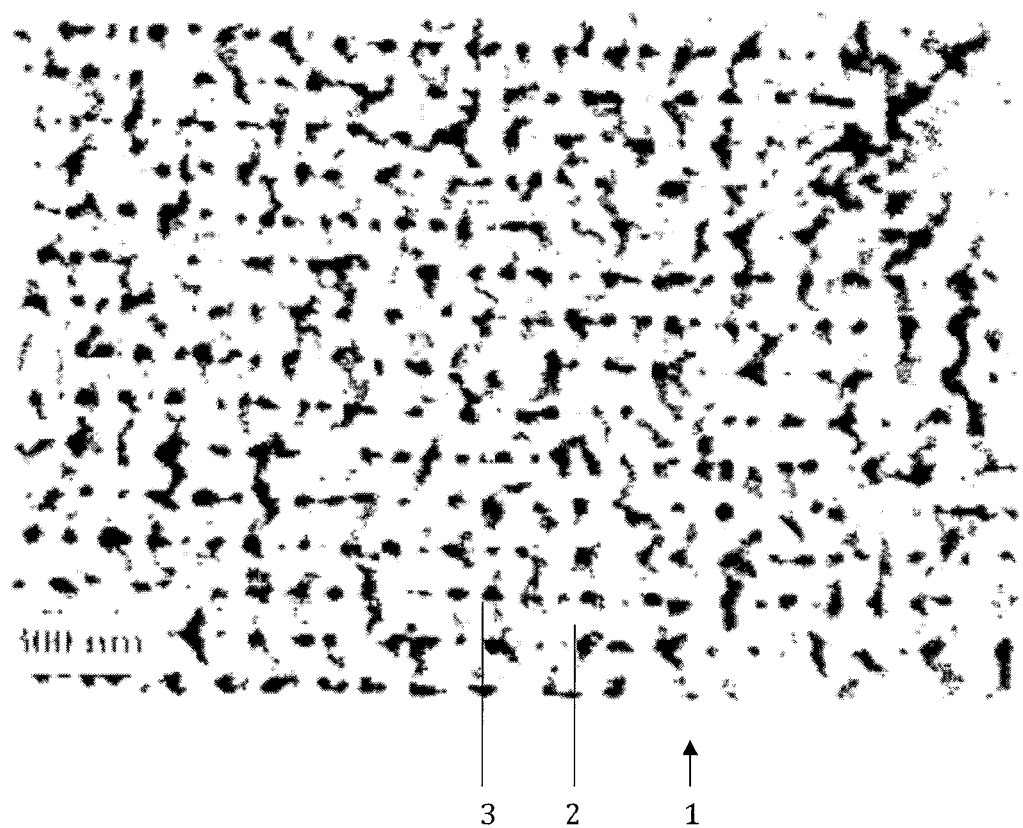

In an alternative embodiment, PDLC material 1 may be holographically fabricated wherein polymer 2 and liquid crystals 3 are exposed to a holographic pattern, i.e. interference pattern, during synthesis. As shown in FIG. 2(a), holographic patterning causes liquid crystals 2 to organize during polymerization within polymer 2 in accordance with a designated pattern. The patterning may be used to create layered liquid crystal structures that increase overall solar energy conversion efficiency and current output. FIG. 2(b) is an SEM image of the morphology of an H-PDLC, showing that the synthesis process causes polymer 2 to cure in the bright fringes of the interference pattern, while liquid crystals 3 diffuse to the darker regions of the interference pattern. In this embodiment, a grating structure is created in the H-PDLC which provides efficient electron pathways within the material. Different H-PDLC morphologies may be achieved depending upon the applied interference pattern. Conductive elements 4 may be added to the H-PDLC system to induce a directional electric current.

The H-PDLC embodiment is advantageous because of its enhanced energy conversion efficiency and high current output. Additionally, this method for synthesizing H-PDLC may enable the production of structures which are thin, flexible, stackable or combinations thereof. In an exemplary embodiment, this method may be used to produce a thin, flexible and stackable PDLC material 1 having a thickness of about 3-30 μm, more preferably, about 3-10 μm and most preferably, about 5 μm.

Figure 3A:
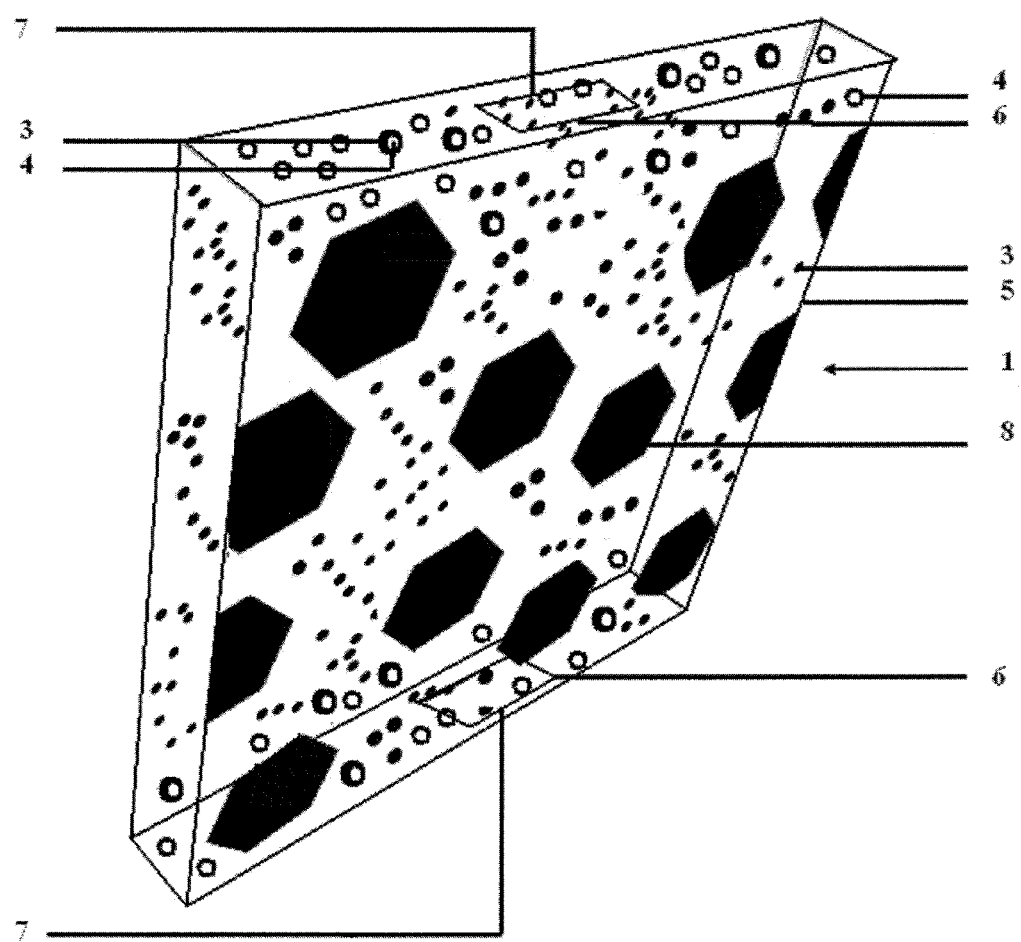
FIG. 3(*a*) is a perspective view of one embodiment of a block co-polymer dispersed liquid crystal material.
Figure 3B:
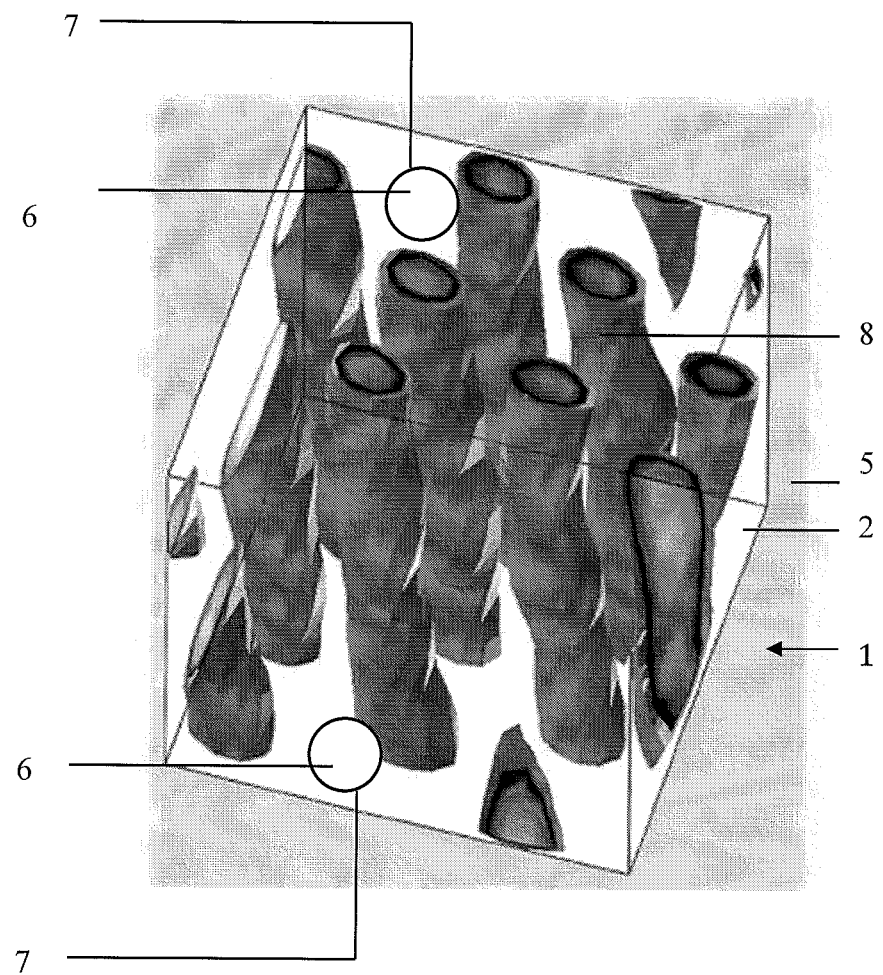

In another embodiment, the PDLC may be a block copolymer dispersed liquid crystal (BCP) system. The BCP system may be self-assembled in the same manner as the self-assembling PDLC. During polymerization, monomers of the PDLC mixture further react to forms block copolymer structures 8 which are dispersed in the PDLC matrix. Thus, the block copolymer structures 8 may be used to drive formation of a particular structure within the polymer matrix. As shown in FIGS. 3(a)-3(b), block co-polymer 8 dispersed in the PDLC matrix may have a wire structure. The resulting BCP system, therefore, may be fabricated with a highly structured morphology that enhances solar energy conversion efficiency by, for example, using the block copolymer structure to integrate in the polymer matrix, a structure that may enhance electrical conduction in the polymer matrix and/or to facilitate and/or guide electrical transport in a particular direction. In an exemplary embodiment, the BCP system may be a bottom-up self-assembling hexagonally packed conductive block co-polymer formed from a liquid crystal substrate. Conductive elements 4 may be either self-assembled or may be incorporated before, during or after polymerization.

In general, the various different embodiments of the PDLC photovoltaic device of the present invention overcome the inefficiencies and limited applications of the prior art. The highly structured morphology of the present invention enhances solar energy conversion efficiency as well as electrical current output. Additionally, because PDLC material 1 may be optically transparent, flexible, durable, and have any geometric configuration or a combination thereof, the PDLC photovoltaic device of the present invention may be more adaptable to a wide variety of applications in comparison to conventional solar cells. Furthermore, the PDLC photovoltaic device of the present invention is inexpensive and easy to manufacture. In particular, no external energy is required for manufacturing the self-assembling embodiments. The device may also be environmentally friendly because it is fabricated from organic materials; unlike the devices of the prior art, the present invention does not require any rare-earth compounds.

The photovoltaic device of the present invention may be used for a wide variety of applications in the fields of alternative energy generation, particularly nano-photonics alternative energy generation. The various novel material properties of the PDLC photovoltaic device enable the customization of the photovoltaic device for different applications. For example, a flexible PDLC photovoltaic device allows for the creation of curved and other multi-plane panels. Such panels may be used to conform to any curved or other multi-planar structures, such as the curved façade of a modern building or a curved surface of an electronic device such as a cell phone case.

Optical transparency enables the use of the PDLC photovoltaic device on or in clear surfaces, such as windows panes, and allows for the invention to be applied to the surface of any structure or product as a paint or coating mixture. In one example, the transparent and flexible thin PDLC films may be laminated onto windows and product surfaces. Transparency of the PDLC material 1 allows the photovoltaic device to be at least substantially invisible and therefore does not have an adverse aesthetic impact. In an exemplary embodiment, the invention may be potentially useful for applications including printable circuitry, flexible displays, paints such as road paints, vehicle paints and house paints, and optical communications.

EXAMPLES

A number of preliminary PDLC formulations have been created and tested. Nematic liquid crystalline material was employed in PEDOT:PSS. Films that have thicknesses between 50 nm and 2 μm were created. The films were examined using a four point probe, optical profilometer, and scanning electron microscope Shown below are three formulations which exhibit good conductivity and dispersion of liquid crystal in the polymer.

TABLE 1

(All Values in Terms of Weight Fraction)

| Formulation | PEDOT:PSS/ Water Dispersion (polymer) | E7 (liquid crystal) | Darocur 250 (photoinitiator) | Tween 20 (surfactant) | Dimethyl Sulfoxide (for added conductivity) |
|---|---|---|---|---|---|
| 1 | 0.9060 | 0.0039 | 0 | 0 | 0.0910 |
| 2 | 0.8969 | 0.0035 | 0.0099 | 0 | 0.0897 |
| 3 | 0.8969 | 0.0035 | 0 | 0.0099 | 0.0897 |

Using a surfactant, a material layer was created in between the liquid crystal droplets and polymer, which may be useful to tune the formulation properties.

The formula for Tween 20 surfactant used in the examples is as follows:

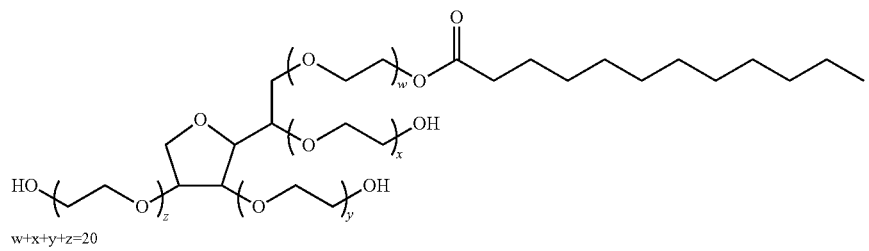

w+x+y+z=20

The formula for PEDOT:PSS used in the examples is as follows:

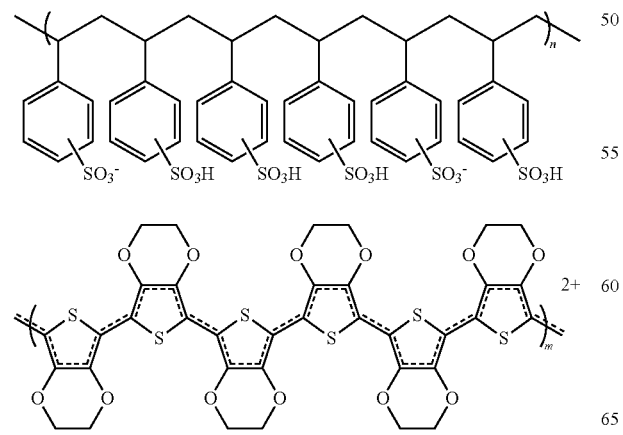

The foregoing examples have been presented for the purpose of illustration and description and are not to be construed as limiting the scope of the invention in any way. The scope of the invention is to be determined from the claims appended hereto.

What is claimed is:

1. A method for fabricating a photovoltaic device comprising the steps of:
synthesizing a polymer dispersed liquid crystal material comprising:
a conductive polymer;
light absorbing liquid crystals dispersed in said conductive polymer; and
conductive elements dispersed on a surface of said conductive polymer by dispersing said light absorbing liquid crystals and said conductive elements in said conductive polymer and curing the conductive polymer, wherein said conductive elements have a density which causes said conductive elements to migrate to said surface of said conductive polymer prior to completion of said curing step thereby forming at least a central region of said polymer dispersed liquid crystal material which does not contain said conductive elements; and
operatively associating at least one electric lead with at least one said conductive element of said polymer dispersed liquid crystal material.

2. The method of claim 1, wherein said synthesizing step comprises the step of photo-curing said polymer dispersed liquid crystal material.

3. The method of claim 1, wherein:
said synthesizing step comprises the step of self-assembling said polymer dispersed liquid crystal material by automatically organizing the conductive elements and the light-absorbing liquid crystals in said conductive polymer.

4. The method of claim 1, wherein said synthesizing step comprises the step of holographically forming said polymer dispersed liquid crystal material.

5. The method of claim 3, wherein said self-assembling step comprises the step of forming block copolymer elements in said polymer dispersed liquid crystal material.

6. The method of claim 1, wherein said conductive elements form both an anode and a cathode of said device.

7. The method of claim 1, wherein said conductive polymer is selected from the group consisting of: PEDOT:PSS, polyaniline and mixtures thereof.

8. The method of claim 1, wherein said conductive elements comprise at least one of metallic nanoparticles and water-complexed metallic nanoparticles.

9. The method of claim 8, wherein said metallic nanoparticles comprise at least one of silver, indium, tin, tin oxide, zinc, zinc oxide, silicon, lead and copper.

10. The method of claim 1, wherein said liquid crystals comprise discotic liquid crystals.

11. The method of claim 10, wherein said liquid crystals further comprise nematic liquid crystals, chiral nematic liquid crystals and combinations thereof.

12. The method of claim 1, wherein said polymer dispersed liquid crystal material is flexible.

13. The method of claim 1, wherein said polymer dispersed liquid crystal material has a solar energy conversion efficiency of greater than 3%.

14. The method of claim 2, wherein:
said synthesizing step comprises the step of self-assembling said polymer dispersed liquid crystal material by automatically organizing the conductive elements and the light-absorbing liquid crystals in said conductive polymer.

15. The method of claim 2, wherein said synthesizing step comprises the step of holographically forming said polymer dispersed liquid crystal material.

16. The method of claim 14, wherein said conductive polymer is selected from the group consisting of: PEDOT:PSS, polyaniline and mixtures thereof.

17. The method of claim 15, wherein said conductive polymer is selected from the group consisting of: PEDOT:PSS, polyaniline and mixtures thereof.

18. The method of claim 16, wherein said conductive elements comprise at least one of metallic nanoparticles and water-complexed metallic nanoparticles.

19. The method of claim 17, wherein said conductive elements comprise at least one of metallic nanoparticles and water-complexed metallic nanoparticles.

20. The method of claim 18, wherein said metallic nanoparticles comprise at least one of silver, indium, tin, tin oxide, zinc, zinc oxide, silicon, lead and copper and said liquid crystals comprise discotic liquid crystals.

* * * * *